United States Patent
Rentschler et al.

(10) Patent No.: US 8,683,265 B2
(45) Date of Patent: Mar. 25, 2014

(54) DEBUG STATE MACHINE CROSS TRIGGERING

(75) Inventors: Eric M. Rentschler, Steamboat Springs, CO (US); Steven J. Kommrusch, Fort Collins, CO (US); Elizabeth M. Cooper, Los Gatos, CA (US); Stephen Ennis, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 496 days.

(21) Appl. No.: 12/980,842

(22) Filed: Dec. 29, 2010

(65) Prior Publication Data

US 2012/0146658 A1   Jun. 14, 2012

Related U.S. Application Data

(60) Provisional application No. 61/421,498, filed on Dec. 9, 2010.

(51) Int. Cl.
*G06F 11/00* (2006.01)

(52) U.S. Cl.
USPC .......................................................... 714/30

(58) Field of Classification Search
USPC ............................................ 714/30; 324/537
See application file for complete search history.

(56) References Cited

U.S. PATENT DOCUMENTS

| | | | |
|---|---|---|---|
| 6,237,123 B1* | 5/2001 | Kim et al. ...................... | 714/733 |
| 2002/0178416 A1* | 11/2002 | Chen et al. ..................... | 714/733 |
| 2005/0034017 A1 | 2/2005 | Airaud et al. | |
| 2005/0138484 A1* | 6/2005 | Moyer et al. .................... | 714/47 |
| 2010/0332909 A1 | 12/2010 | Larson | |
| 2011/0320855 A1 | 12/2011 | Ambroladze et al. | |
| 2012/0150474 A1* | 6/2012 | Rentschler et al. ........... | 702/117 |

* cited by examiner

*Primary Examiner* — Yair Leibovich

(57) ABSTRACT

An embodiment of an electronic system includes a first electronic module, a second electronic module, a first debug circuit integrated with the first electronic module, a second debug circuit integrated with the second electronic module, and a communications interface between the first debug circuit and the second debug circuit. The first debug circuit is configured to determine that a triggering event has occurred, and to produce a first cross trigger signal on the communications interface in response to determining that the triggering event has occurred. The second debug circuit is configured to detect the first cross trigger signal on the communications interface, and to perform an action in response to detecting the first cross trigger signal.

19 Claims, 7 Drawing Sheets

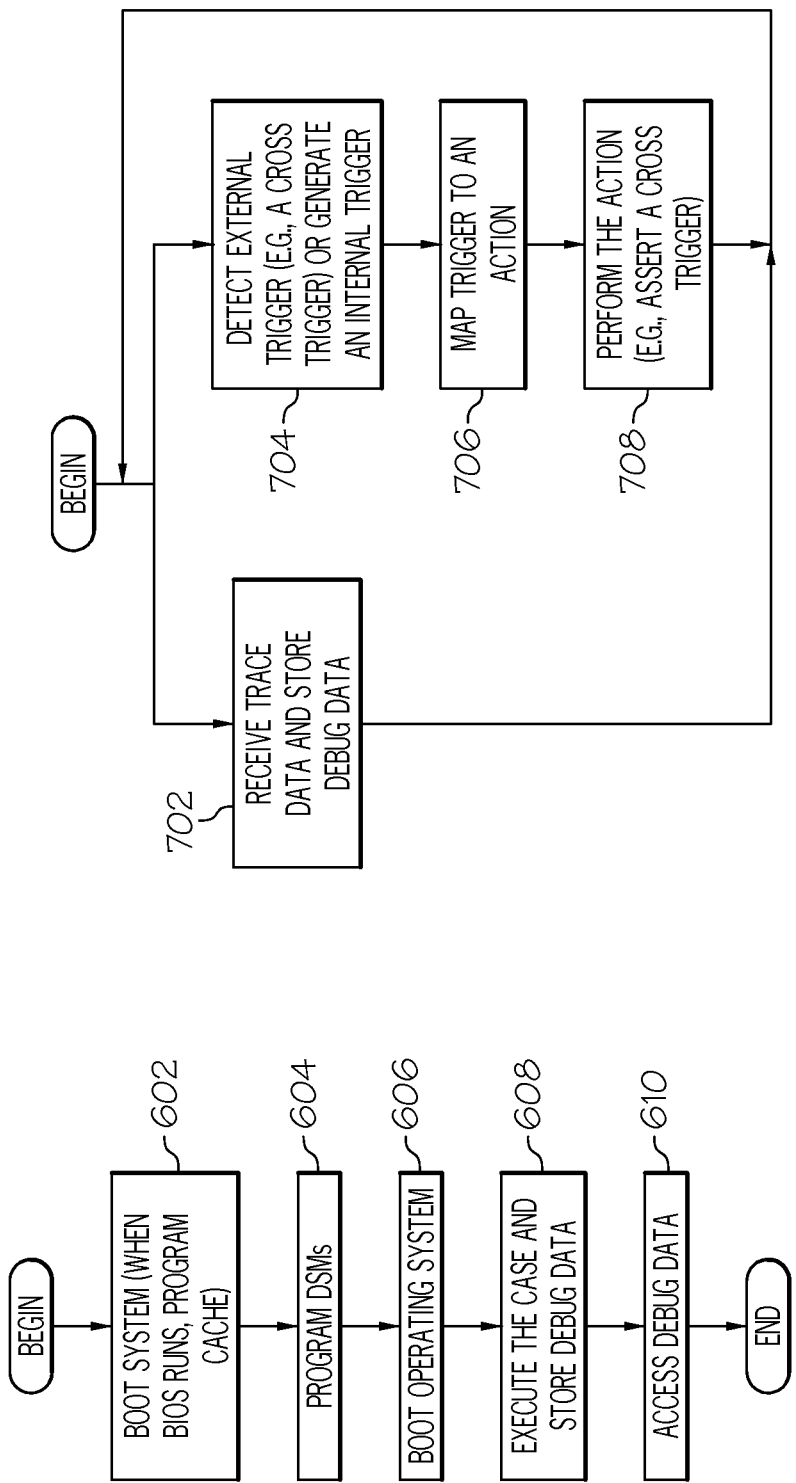

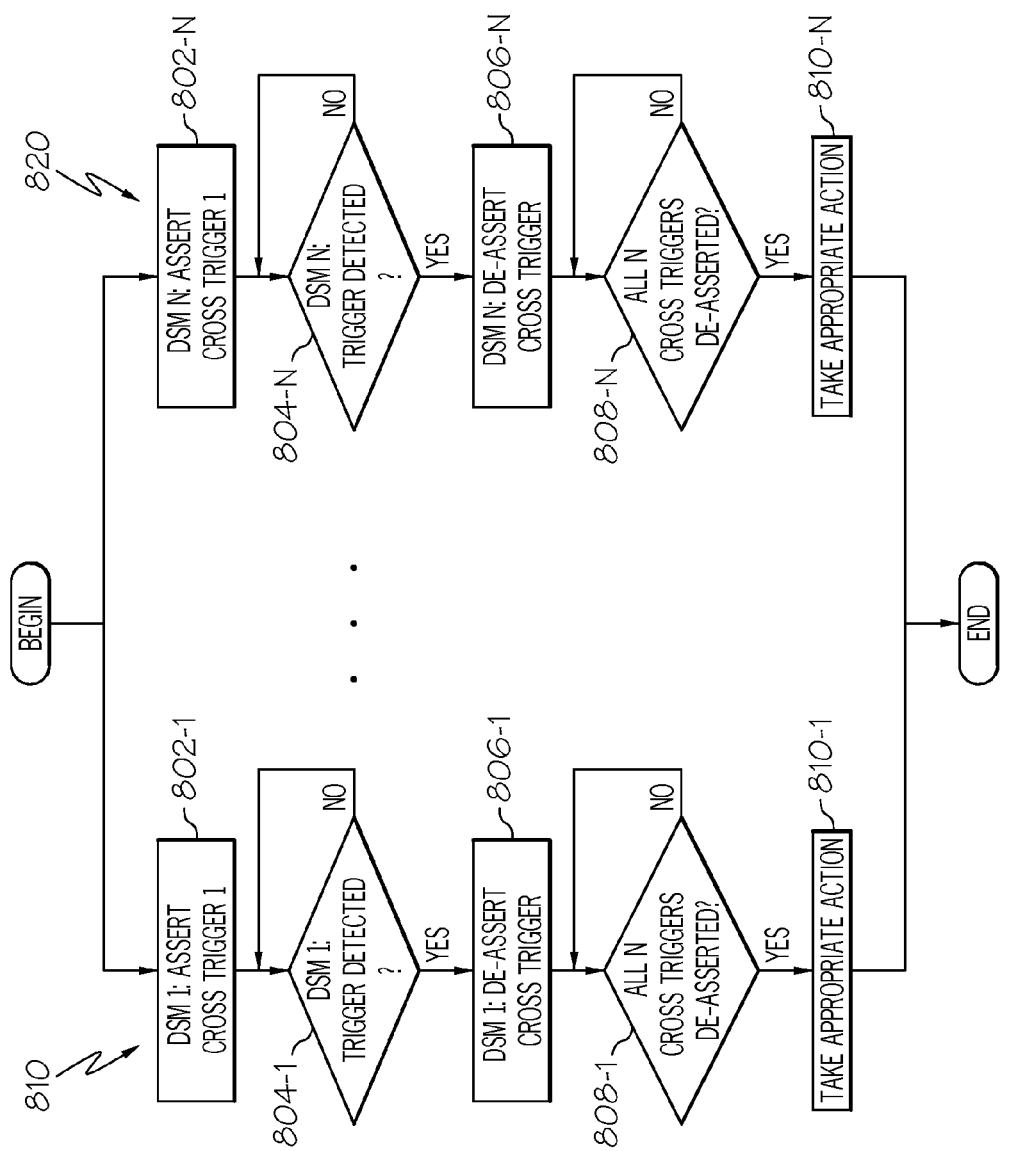

DEBUG STATE MACHINE CROSS TRIGGERING

RELATED APPLICATION

This application claims priority to a provisional application having Ser. No. 61/421,498, which was filed on Dec. 9, 2010.

TECHNICAL FIELD

Embodiments of the subject matter described herein relate generally to electronic circuits, and more particularly, relate to electronic circuits and debug operations performed thereon.

BACKGROUND

In some integrated circuits, debug circuitry is integrated with one or more of the integrated circuit's electronic modules (e.g., processor cores) for the purpose of providing debug functionality for those electronic modules. Typical debug circuitry consists of a hardware block that has visibility, during operations, to an electronic module with which it is integrated. The debug circuitry may monitor various signals that the electronic module produces, for example, and may output or log information reflecting those signals for subsequent analysis (e.g., by external test equipment). This information may be particularly useful during hardware validation, as it may indicate problems with the hardware that may be corrected in subsequent design iterations (e.g., in subsequent versions of silicon).

Some integrated circuits include multiple electronic modules for which debug capability is desired (e.g., multiple processor cores, a Northbridge, a Southbridge, and so on). Accordingly, such integrated circuits may include multiple debug circuits (e.g., a debug circuit for each module for which debug capability is desired). During operations, each debug circuit may perform debug functions autonomously and independently from any other debug circuits that may be included in the integrated circuit. In other words, operations performed by one debug circuit are not influenced by operations performed by other debug circuits, and a debug circuit associated with one electronic module has no view of other electronic modules or their associated debug circuits.

Although debug circuits may provide significant visibility to what is occurring within various electronic modules, the isolated nature of each debug circuit's functionality makes it difficult accurately to debug state-related aspects of the integrated circuit that involve the participation of multiple electronic modules.

SUMMARY OF EMBODIMENTS

An embodiment includes a method for performing debug operations in an electronic system that includes a first electronic module and a second electronic module. According to the method, a first debug circuit, which is integrated with the first electronic module, determines that a triggering event has occurred, and the first debug circuit produces a first cross trigger signal on a communications interface between the first debug circuit and a second debug circuit in response to determining that the triggering event has occurred. In a further embodiment, the second debug circuit, which is integrated with the second electronic module, detects the first cross trigger signal, and the second debug circuit performs an action in response to detecting the first cross trigger signal.

Another embodiment includes a method for performing debug operations in an electronic system that includes a first electronic module and a second electronic module. According to the method, a first debug circuit, which is integrated with the first electronic module, detects that a first cross trigger signal has been produced on a communications interface between the first debug circuit and a second debug circuit, and the first debug circuit performs an action in response to detecting the first cross trigger signal. The second debug circuit is integrated with the second electronic module. In a further embodiment, and prior to the first debug circuit detecting that the first cross trigger signal has been produced, the second debug circuit determines that a triggering event has occurred, and the second debug circuit produces the first cross trigger signal on the communications interface in response to determining that the triggering event has occurred.

Yet another embodiment includes an electronic system that includes a first electronic module, a second electronic module, a first debug circuit integrated with the first electronic module, a second debug circuit integrated with the second electronic module, and a communications interface between the first debug circuit and the second debug circuit. The first debug circuit is configured to determine that a triggering event has occurred, and to produce a first cross trigger signal on the communications interface in response to determining that the triggering event has occurred. The second debug circuit is configured to detect the first cross trigger signal on the communications interface, and to perform an action in response to detecting the first cross trigger signal.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 6 is a flow diagram of a method for setting up and conducting debug operations, in accordance with an embodiment;

FIG. 7 is a flow diagram of a method for operating debug circuitry in the context of a debug operation, in accordance with an embodiment; and FIG. 8 is a flow diagram of a method for operating debug circuitry in a level mode, in accordance with an embodiment.

DETAILED DESCRIPTION

Figure 1:
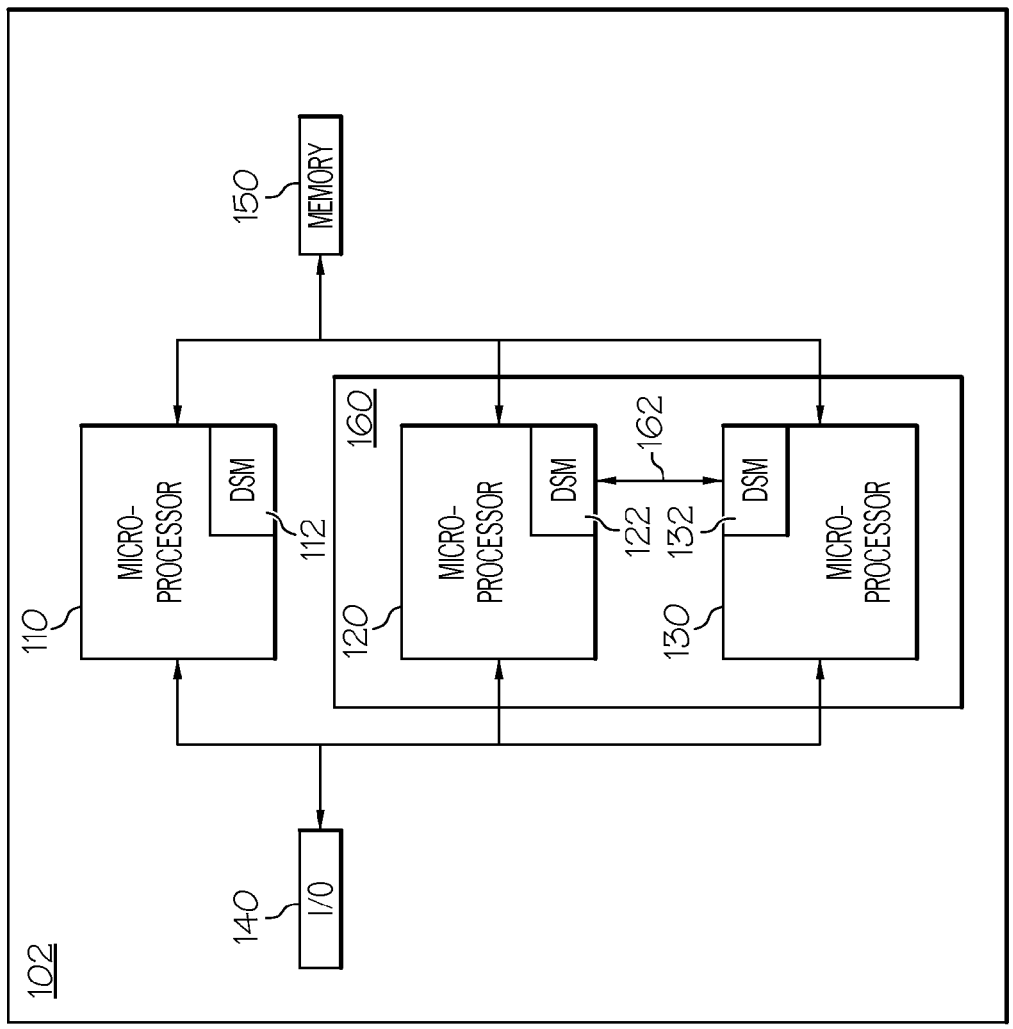
FIG. 1 is a block diagram of an electronic system, in accordance with an embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to debug circuits, referred to herein as debug state machines (DSMs), which may be integrated with multiple electronic modules of an integrated circuit. For example, a distinct DSM may be integrated with each of multiple cores of a multiple-core central processing unit (CPU), as well as being integrated with other electronic modules of the CPU (e.g., a Northbridge, a Southbridge, a Graphics Processing Unit (GPU), a special purpose processor, other types of processors, and so on), in an embodiment. Embodiments also include apparatus and methods that facilitate inter-communications between distinct DSMs within a single integrated circuit, between DSMs of multiple integrated circuits of a multi-chip module (MCM), and between DSMs of multiple packaged devices (e.g., DSM inter-communications from socket-to-socket). This inter-communication is referred to herein as "cross triggering."

DSMs may provide significant visibility to what is occurring in the electronic modules with which they are integrated. By providing methods and apparatus by which DSMs may communicate with each other, state-related aspects of a system that involve simultaneous participation of multiple electronic modules (e.g., multiple cores, a Northbridge, a Southbridge, a GPU, and so on) may be more accurately debugged. In various embodiments, the inter-communications made possible with the cross triggers enables the activities of the various DSMs to be tracked and coordinated across an entire system. Accordingly, the context of DSM activities across the entire system may be comprehended.

Before discussing the details of the various embodiments in detail, certain terminology is defined below to enhance understanding of the various embodiments. As used herein, a "DSM" refers to a discrete instantiation of debug circuitry (e.g., a state machine) that is integrated with an electronic module of an electronic system (e.g., a computing system), and which is configured to detect one or more "triggering events" and to perform one or more responsive "actions," where both the triggering events and the actions are events that occur in the context of debug operations for the electronic system. A DSM is configured to provide visibility (e.g., to external test equipment, such as a Hardware Debug Tool (HDT)) to the electronic module's functionality. The term "integrated with," as used herein to describe the coupling between a DSM and an electronic module, means that the DSM is electrically and/or communicatively coupled with portions of the electronic module that enable the DSM to detect signals produced by the electronic module. For example, but not by way of limitation, a DSM that is "integrated with" an electronic module may have access to one or more registers and/or other data storage locations within the electronic module, which enable the DSM to receive trace data that is produced and/or received by the electronic module while the electronic module is performing various operations (e.g., while the electronic module is executing software associated with a trace or test case). In an embodiment, observability of the trace data is provided to a DSM by way of a "debug bus," which provides an interface between portions of the electronic module and the DSM with which it is integrated. A DSM that is "integrated with" an electronic module is included on the same die as the electronic module, in an embodiment. The DSM may be included within the physical footprint of the electronic module or outside the physical footprint of the electronic module, in various embodiments.

As used herein, the term "triggering event" means an event detected by a DSM, which causes the DSM to take a particular action (e.g., based on a trigger-to-action mapping adhered to by the DSM). An "event" may be the receipt of a signal (or a combination of signals), the detection of a value (e.g., a register, clock or counter value) or another event that is detectable by the DSM, for example. Triggering events may be "internal" or "external." An "internal triggering event" means an event that is generated within the DSM itself, and which provides an impetus for the DSM to perform a responsive action. An "external triggering event" means an event that is generated by a source external to the DSM (e.g., a debug bus, another DSM, and so on), and which also provides an impetus for the DSM to perform a responsive action. According to an embodiment, a particular type of external triggering event is a "cross trigger," which is a signal that is conveyed over one or more dedicated communication lines between DSMs (referred to herein as a "cross trigger bus"). "Cross triggering" is a term that is used herein to refer to communication methods and apparatus by which multiple DSMs of an electronic system may communicate in order to coordinate their operations. "Pulse mode" cross triggering refers to communications between DSMs that includes one DSM providing a signal pulse on the cross trigger bus to indicate the occurrence of an event. In contrast, "level mode" cross triggering refers to a method by which signals asserted on the debug bus may be evaluated to determine when multiple DSMs (up to all DSMs) have detected a triggering event.

Similar to triggering events, actions also may be "internal" or "external." An "internal" action is initiated by a particular DSM in response to a triggering event, where the internal action has a direct effect within the DSM itself. For example, but not by way of limitation, an internal action may include the DSM performing a state transition, generating a signal that is consumed within the DSM itself, and updating a value in an internal register. In contrast, an "external" action means a signal that is generated by a DSM in response to an internal or external triggering event, where the external action is observable by other DSMs and/or other components of the electronic system. For example, but not by way of limitation, an external action may include the DSM generating a cross trigger on the cross trigger bus. In addition to providing cross triggers for analysis by other DSMs, a DSM may perform the action of triggering external analysis equipment (e.g., an HDT). DSMs also, optionally, may externally "irritate" as triggering events are detected, where the term "irritate" may be defined as a DSM initiating or preventing events in logic external to the DSM.

As the above description indicates, a cross trigger is produced by a first DSM as an action in response to another triggering event, and the cross trigger may cause another DSM that receives it to perform a responsive action, as well. Accordingly, a cross trigger may be considered to be both a triggering event and an action, as those terms are defined herein. As will be described in more detail later, a DSM is programmable, and whether or not a particular instantiation of a DSM takes action in response to a triggering event depends on the programming of that DSM. In the case of cross triggers, for example, a DSM that receives a cross trigger generated by another DSM may or may not perform a responsive action, depending on its programming.

The electronic system may be implemented on a single die, in an MCM, and/or as a plurality of discretely packaged devices (e.g., socketed devices disposed on one or more printed circuit boards (PCBs)). In an embodiment, DSMs that are integrated with multiple electronic modules of a single die communicate with each other over the cross trigger bus, which also is an integral part of the die. In other embodiments, discussed in more detail below, DSMs of different die of an MCM may communicate cross triggers between each other, and/or DSMs in devices installed in different sockets of a PCB (or multiple PCBs) may communicate cross triggers between each other.

FIG. 1 is a simplified block diagram of an electronic system 100, in accordance with an example embodiment. It should be understood that FIG. 1 is a simplified representation of an electronic system 100 for purposes of explanation and ease of description, and FIG. 1 is not intended to limit the subject matter in any way. Practical embodiments of the electronic system 100 may include other devices and components for providing additional functions and features, and/or the electronic system 100 may be part of a larger system, as will be understood. In other words, although a particular configuration of computing, memory, and other electrical components are depicted in FIG. 1, it is to be understood that the example configuration is intended to provide a framework for discussing embodiments of the inventive subject matter relating to cross triggering between DSMs. Accordingly, the example configuration is not intended to depict all components of a functional electronic system, and the embodiments are not intended to be limited to implementation within an electronic system having the configuration of FIG. 1.

Electronic system 100 is contained on a motherboard 102 (a printed circuit board), which includes one or more sockets, busses, slots, connectors, and conductors (not illustrated) with which various computing, memory, and other electrical components of the system are physically, electrically, and/or communicatively coupled. More particularly, electronic system 100 includes at least one microprocessor 110, 120, 130, one or more input/output (I/O) peripherals 140, and memory 150. Although electronic system 100 may include a number of other system components (e.g., clocks, power supplies, other processing components, discrete electronics, and so on), such components are excluded from FIG. 1 and are not discussed herein for the purposes of clarity and simplicity.

The I/O peripherals 140 generally represent the hardware, software, and/or firmware components configured to support communications to/from the microprocessors 110, 120, 130 and one or more peripheral (or external) devices. For example, the I/O peripherals 140 may be realized as busses or other communications interfaces configured to support data transmission to/from the microprocessors 110, 120, 130 in accordance with one or more data communication protocols.

Memory 150 generally represents the main memory or primary memory for the electronic system 100. Depending on the embodiment, memory 150 may be realized as a hard disk, flash memory, ROM memory, RAM memory, another suitable storage medium known in the art or any suitable combination thereof. Memory 150 maintains data and/or program instructions to support operations of the electronic system 100 and/or microprocessors 110, 120, 130 as will be appreciated in the art. In an exemplary embodiment, memory 150 that is implemented separately from microprocessors 110, 120, 130 (e.g., on another chip and/or die) may be understood as being external to microprocessors 110, 120, 130.

Microprocessor 110 represents a discrete processing component that is implemented on a single die that is separately packaged from other system components, whereas microprocessors 120, 130 represent processing components that form portions of an MCM 160 (i.e., an electronic package that includes multiple die and/or other discrete components). Each of microprocessors 110, 120, 130 may include one or more DSMs 112, 122, 132, which communicate and coordinate operations through the implementation of cross triggering. Although later-described figures will discuss the concept of cross triggering within a "system on a chip" (SOC) in detail, the embodiment of FIG. 1 is intended to convey the concept that cross triggering also may be performed in conjunction with DSMs 112, 122, 132 that are located on different die within a same package (e.g., MCM 160) and/or on die within different packages.

As mentioned above, cross triggering may be implemented between DSMs on die within a same package (referred to herein as "die-to-die cross triggering"), in an embodiment. For example, cross triggering may be implemented between DSMs 122, 132 associated with microprocessors 120, 130 within MCM 160. In order to implement die-to-die cross triggering, cross triggers may be communicated between the DSMs 122, 132 via a Die-to-Die Communication Link (DDCL 162) or other communications interface between DSMs 122, 132. Die-to-die cross triggers may be communicated from one die to another using dedicated unidirectional pins, in an embodiment, where a DSM in one die drives a cross trigger signal on an output pin of the die, and another DSM on another die receives the cross trigger signal on an input pin of its respective die. In an alternate embodiment, die-to-die cross triggers may be communicated using dedicated bidirectional pins, where a first die both sends and receives cross triggers on the same pin(s), and the pin(s) are electrically connected to similar pins on a second die. In still another alternate embodiment, die-to-die cross triggers may be communicated using a communication protocol over an external bus, which interconnects the two dies.

In addition or alternatively, cross triggering may be implemented between DSMs on die within different packages (referred to herein as "socket-to-socket cross triggering"), in another embodiment. For example, cross triggering may be implemented between DSMs 112, 122 of microprocessors 110 and 120, which are housed in different packages. In order to implement socket-to-socket cross triggering, cross triggers may be communicated between the DSMs 112, 122 via a bi-directional, wired-OR configuration, in an embodiment. More particularly, certain package pins (e.g., pins controlled to implement a bi-directional mode) and socket-to-socket conductors (and other intervening circuitry) on the motherboard 102 (none of which are illustrated in FIG. 1) may be utilized as a communications interface to provide bi-directional communications between DSMs 112, 122 (i.e., from one socket to another). In an embodiment in which package pins are re-configured during testing to support cross triggering, no new package pins need to be added to support the cross triggering. Alternatively, DSMs 112, 122 may communicate socket-to-socket cross triggers via a packet-based communication technique (e.g., communications may be conducted over the HyperTransport (HT) fabric). Socket-to-socket cross trigger communications may be implemented over an existing communication bus within an existing communication protocol (e.g. an HT communication protocol) or socket-to-socket cross trigger communication may be implemented over a dedicated (e.g., special purpose) communication bus using a dedicated communication protocol. Socket-to-socket cross trigger communication packets may be communicated directly between sockets, or may be routed from socket to socket by intermediate electronic modules (e.g., buffer and/or routing chips) in the electronic system.

Any one or more of microprocessors 110, 120, 130 may comprise an SOC, which includes a plurality of electronic modules, each of which includes at least one DSM. As indicated previously, the various DSMs of an electronic system, including the various DSMs of an SOC, communicate and coordinate operations through the implementation of cross triggering (referred to herein as "intra-die cross triggering"). Embodiments of cross triggering performed in the context of an SOC will now be discussed in more detail.

Figure 2:
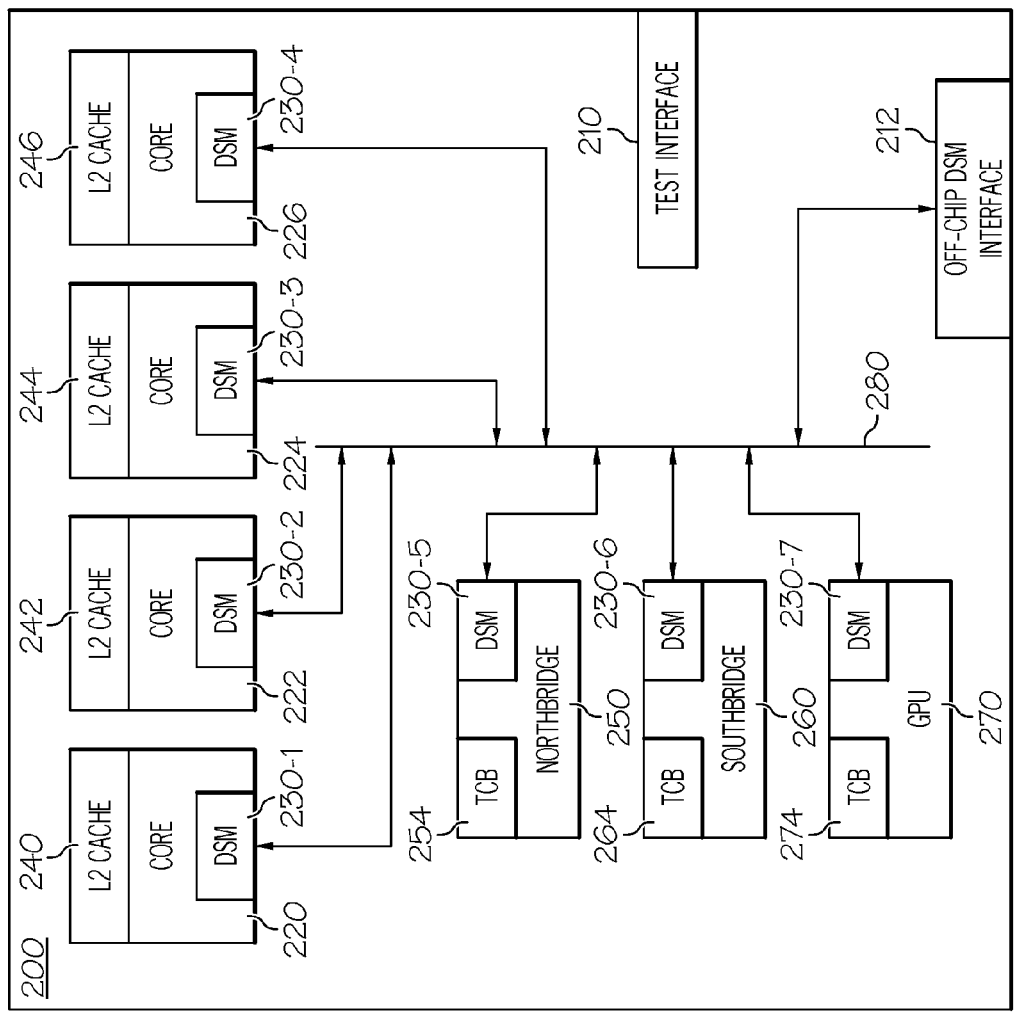
FIG. 2 is a block diagram of a system on a chip, in accordance with an embodiment.

FIG. 2 is a block diagram of an SOC 200, in accordance with an example embodiment. It should be understood that FIG. 2 is a simplified representation of an SOC 200 for purposes of explanation and ease of description, and FIG. 2 is not intended to limit the subject matter in any way. Practical embodiments of the SOC 200 may include other devices and components for providing additional functions and features, as will be understood.

In an exemplary embodiment, SOC 200 includes a plurality of processing cores 220, 222, 224, 226 (each with an integrated DSM 230-1, 230-2, 230-3, 230-4), a plurality of trace data storage elements 240, 242, 244, 246, 254, 264, 274 (e.g., L2 caches and Trace Cache Buffers (TCBs)), a Northbridge 250 (or memory controller) (with an integrated DSM 230-5), a Southbridge 260 (with an integrated DSM 230-6), a GPU 270 (with an integrated DSM 230-7), and a cross trigger bus 280. Cross triggering to DSMs (not illustrated) on other die within the same package (e.g., in an MCM) and/or other packages may be achieved via off-chip DSM interface 212. Although FIG. 2 depicts each of processing cores 220, 222, 224, 226, Northbridge 250, Southbridge 260, and GPU 270 as including an associated DSM 230-1, 230-2, 230-3, 230-4, 230-5, 230-6, 230-7 (collectively "230"), some of these electronic modules may not include a DSM. In such cases, the electronic module may, instead, simply port signals in and out, as they relate to debug operations, or some of these electronic modules may not support debug operations at all.

Although SOC 200 is illustrated as including four cores 220, 222, 224, 226, an SOC may include more or fewer cores, in other embodiments (including as few as one single core). In addition, although SOC 200 is illustrated as including a single Northbridge 250, Southbridge 260, and GPU 270, some or all of these electronic modules may be excluded from SOC 200 (e.g., they may be located off-chip), in other embodiments. Furthermore, although SOC 200 is illustrated as including only one Northbridge 250, an SOC may include more than one Northbridge, in other embodiments. Besides the processing components and busses illustrated in FIG. 2, an SOC may include additional or different processing components, busses, and other electronic devices and circuitry, in various embodiments.

Processing cores 220, 222, 224, 226 generally represent the main processing hardware, logic and/or circuitry for the SOC 200, and each processing core 220, 222, 224, 226 may be realized using one or more arithmetic logic units (ALUs), one or more floating point units (FPUs), one or more memory elements (e.g., one or more caches), discrete gate or transistor logic, discrete hardware components, or any combination thereof. Although not illustrated in FIG. 2, each processing core 220, 222, 224, 226 may implement its own associated cache memory element (e.g., a level one or L1 cache) in proximity to its respective processing circuitry for reduced latency.

Northbridge 250, which also may be referred to as a "memory controller," in some systems, is configured to interface with I/O peripherals (e.g., I/O peripherals 140, FIG. 1) and memory (e.g., memory 150, FIG. 1). Northbridge 250 controls communications between the components of SOC 200 and the I/O peripherals and/or external memory. Southbridge 260, which also may be referred to as an "I/O controller hub," in some systems, is configured to connect and control peripheral devices (e.g., relatively low speed peripheral devices). GPU 270 is a special purpose microprocessor, which offloads and accelerates graphics rendering from cores 220, 222, 224, 226.

In the illustrated embodiment, caches 240, 242, 244, 246 and TCBs 254, 264, 274 provide intermediary memory elements having reduced size relative to external memory for temporarily storing data and/or instructions retrieved from external memory or elsewhere, and/or data produced by processing cores 220, 222, 224, 226, Northbridge 250, Southbridge 260, and GPU 270. For example, in an embodiment, caches 240, 242, 244, 246 and TCBs 254, 264, 274 provide memory elements for storing debug information (or "trace data") collected and/or produced by DSMs 230 during debug operations associated with the respective electronic modules with which they are integrated. In the illustrated embodiment, caches 240, 242, 244, 246 are in close proximity to and coupled between a respective processing core 220, 222, 224, 226 and the Northbridge 250. In this regard, caches 240, 242, 244, 246 may alternatively be referred to as core-coupled caches, and each core-coupled cache 240, 242, 244, 246 maintains data and/or program instructions previously fetched from external memory that were either previously used by and/or are likely to be used by its associated processing core 220, 222, 224, 226. Caches 240, 242, 244, 246 are preferably larger than L1 caches implemented by the processing cores 220, 222, 224, 226 and function as level two caches (or L2 caches) in the memory hierarchy. SOC 200 also may include another higher level cache (e.g., a level three or L3 cache, not illustrated) that is preferably larger than the L2 caches 240, 242, 244, 246.

In an exemplary embodiment, the SOC 200 includes a test interface 210 that comprises a plurality of pins dedicated for use in testing and/or configuring the functionality of the SOC 200. In one embodiment, the test interface 210 is compliant with the IEEE 1149.1 Standard Test Access Port and Boundary-Scan Architecture, that is, the Joint Test Action Group (JTAG) standards. Although the interconnections are not specifically illustrated in FIG. 2, the DSMs 230 are coupled to the test interface 210 and receive signals and/or bits from the test interface 210 that establish (or "program") a configuration for each DSM 230. In response, each DSM 230 operates according to the programmed configuration. In this regard, in an exemplary embodiment, each of the DSMs 230 may be programmed to implement a customized version of a cross triggering process, as described in greater detail below.

Each DSM 230 may be configured (e.g., programmed) differently from the other DSMs 230 in SOC 200 and/or in other parts of an electronic system. More particularly, a DSM 230 may be programmed by establishing values in various DSM registers, which essentially pre-select which triggering events a DSM 230 may take action in response to detecting, and also pre-select the corresponding actions. In addition, certain triggering events and actions may not be programmable (e.g., pre-selectable), and a DSM 230 may take a particular action in response to a particular triggering event regardless of any DSM programming that may have been performed.

According to an embodiment, a DSM 230 of an embodiment may support one or more functions selected from a group consisting of: 1) trace start/stop; 2) trace filtering; 3) cross triggering between DSMs; 4) clock stopping; 5) triggering external analysis equipment (e.g., providing HDT interrupts); and 6) providing a flexible microcode interface. Embodiments of the inventive subject matter relate primarily to cross triggering between DSMs, and accordingly, the remainder of the description is focused on this DSM capability, although some of the other capabilities are covered in less detail, as well.

According to an embodiment, cross triggering is implemented via cross trigger bus 280. Cross trigger bus 280 includes one or more, bi-directional conductors, which provide for signaling communication between DSMs 230. According to a particular embodiment, cross trigger bus 280 includes four parallel conductors, although cross trigger bus 280 may include more or fewer conductors, in other embodiments. Cross trigger bus 280 may be considered to be a "communications interface" between DSMs 230.

In response to detecting the occurrence of a triggering event for which a DSM 230 automatically should respond or that the DSM 230 has been programmed to respond to (e.g., a "pre-select triggering event"), the DSM 230 performs a corresponding action, as mentioned previously. According to an embodiment, a trigger-to-action map may be programmed into the DSM 230, which instructs the DSM 230 as to which particular action to perform when it detects a particular triggering event. The types of triggering events to which a DSM 230 will respond, and the responsive actions that the DSM 230 will implement depend, at least in part, on the DSM's programming, as mentioned above. In addition, certain types of internal and external triggering events and certain types of internal and external actions may be commonly attributed to DSMs 230 that are integrated with particular types of electronic modules (e.g., DSMs 230-1 through 230-4 that are integrated with cores 220, 222, 224, 226 may take different actions in response to different triggering events from the actions taken in response to triggering events detected by a DSM 230-5 that is integrated with Northbridge 250). For example, but not by way of limitation, a DSM 230 may be programmed to take one or more actions in response to one or more triggering events as follows:

Internal triggering events: A DSM may internally generate and respond to one or more internal triggering events selected from a group consisting of, but not limited to: a counter matching a first value; a clock count matching a second value; trace data matching a third value; trace data exceeding a fourth value; debug data matching a fifth value; a debug bus bit having a pre-defined state; a debug bus bit transition occurring; a random event occurring (e.g., as determined based on seed, polynomial, match, and mask registers); a flag being asserted.

External triggering events: A DSM may detect and respond to one or more external triggering events selected from a group consisting of, but not limited to: receiving one or more signals from one or more sources external to the first electronic module, wherein the one or more signals are selected from a group consisting of a cross trigger signal on the communications interface; a trap signal; a clock stop signal; an error signal; a performance monitor signal; an interrupt; a breakpoint; a microcode-based trigger (e.g., breakpoints, performance monitors, interrupts, and error events), and a timer overflow.

Internal Actions: In response to a triggering event, a DSM may take one or more internal actions selected from a group consisting of, but not limited to: performing a state transition; clearing a clock counter; stopping a counter; incrementing a general purpose counter; toggling a state bit of a general purpose counter; clearing a general purpose counter; setting or clearing a flag; toggling a random number; and enabling a pseudo-random event generator that can be used as a triggering event source for the DSM.

External Actions: In response to a triggering event, a DSM may take one or more external actions selected from a group consisting of, but not limited to: generating a cross trigger signal on the communications interface (e.g., asserting a cross trigger on the cross trigger bus 280, a die-to-die cross trigger, or a socket-to-socket cross trigger); generating a core stop clock signal; generating a die-wide stop clock signal; generating a self refresh signal for a memory (e.g., memory 150, FIG. 1); generating a communication interface receive disable signal; generating a trace store signal; generating a machine check exception (MCE) signal; generating a debug event signal; triggering a debug microcode interrupt; setting and clearing various bits in a DSM microcode register to be read by microcode upon a debug microcode interrupt; starting storage of debug data to a state capture buffer (e.g., to a TCB and/or L2 cache); stopping storage of debug data to a state capture buffer; and storing a clock count to a state capture buffer.

As mentioned above, one action that may be performed by the DSM 230 is for the DSM 230 to assert a cross trigger. According to an embodiment, a DSM 230 may assert a cross trigger by providing a signal pulse (e.g., a one-cycle signal pulse) on one of the cross trigger conductors of cross trigger bus 280. In this "pulse mode" of operation, every DSM 230 may see cross triggers that are asserted from every other DSM 230, although a DSM 230 that asserts a cross trigger does not observe or respond to its own cross trigger, in an embodiment. According to another embodiment, a "level mode" of operation may be implemented, which enables the DSMs 230 to determine whether a particular triggering event has been observed by a group (up to and including all) of the DSMs 230. Both pulse and level modes of operation will be described in more detail below.

As described above, the DSMs 230 are integrated with different types of electronic modules, and some or all of the electronic modules may be working in different clock domains. According to the pulse mode embodiment implemented in SOC 200, a single, one-cycle pulse on a cross trigger conductor being driven from a DSM 230 in one clock domain will be viewed by all other DSMs 230 in all other clock domains as a one-cycle pulse in each of their respective clock domains. Accordingly, even with the disparate clock domains, a one-cycle pulse in one domain will not result in zero or an arbitrary number of pulses in another domain. Because some of the clock domains may be significantly faster than other clock domains, however, the rate at which a DSM 230 associated with a relatively fast clock domain may issue consecutive (e.g., back-to-back) cross triggers may be controlled (e.g., slowed) to ensure that DSMs 230 in relatively slow clock domains will have time to detect a cross trigger before it is de-asserted and replaced by another cross trigger.

Figure 3:
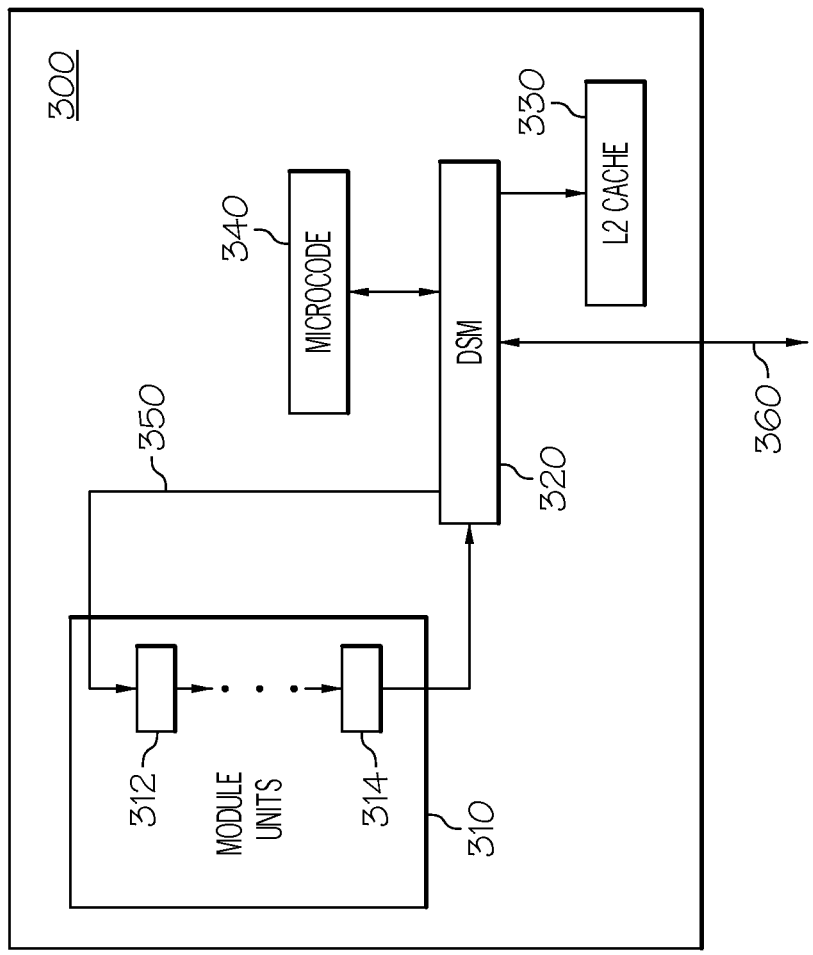
FIG. 3 is a block diagram of an electronic module with an integrated debug state machine, in accordance with an embodiment.

FIG. 3 is a block diagram of an electronic module 300 with an integrated DSM 320, in accordance with an embodiment. For example, electronic module 300 may be a processing core (e.g., one of cores 220, 222, 224, 226, FIG. 2), although electronic module 300 may be a different type of electronic module, as well. In an embodiment in which electronic module 300 is a processing core, DSM 320 may interface with microcode 340. This interface enables DSM 320 to observe the microcode being executed by the electronic module 300 and/or to modify execution of the microcode by the electronic module 300. In addition, as mentioned previously, DSM 320 may be capable of storing trace data in trace data storage (e.g., L2 cache 330), which includes information collected and/or produced by DSM 320 during execution of various operations performed by the electronic module 300.

Electronic module 300 also includes one or more "module units" 310, each of which may be configured to perform a set of actions or computations associated with the functionality of electronic module 300. DSM 320 is integrated with the various module units 310 by way of debug bus 350. Essentially, debug bus 350 functions as a conduit through which signals produced at various observability points 312, 314 within the module units 310 may be conveyed to DSM 320. Although only two observability points 312, 314 are shown in FIG. 3, a multitude of observability points may be established along debug bus 350. At each observability point 312, 314, various multiplexing structures may funnel data onto the debug bus 350. Some or all of the signals received via debug bus 350 may be considered as triggering events by DSM 320, which may invoke DSM 320 to produce a cross trigger on a cross trigger bus 360, as described in more detail elsewhere, herein.

Figure 4:
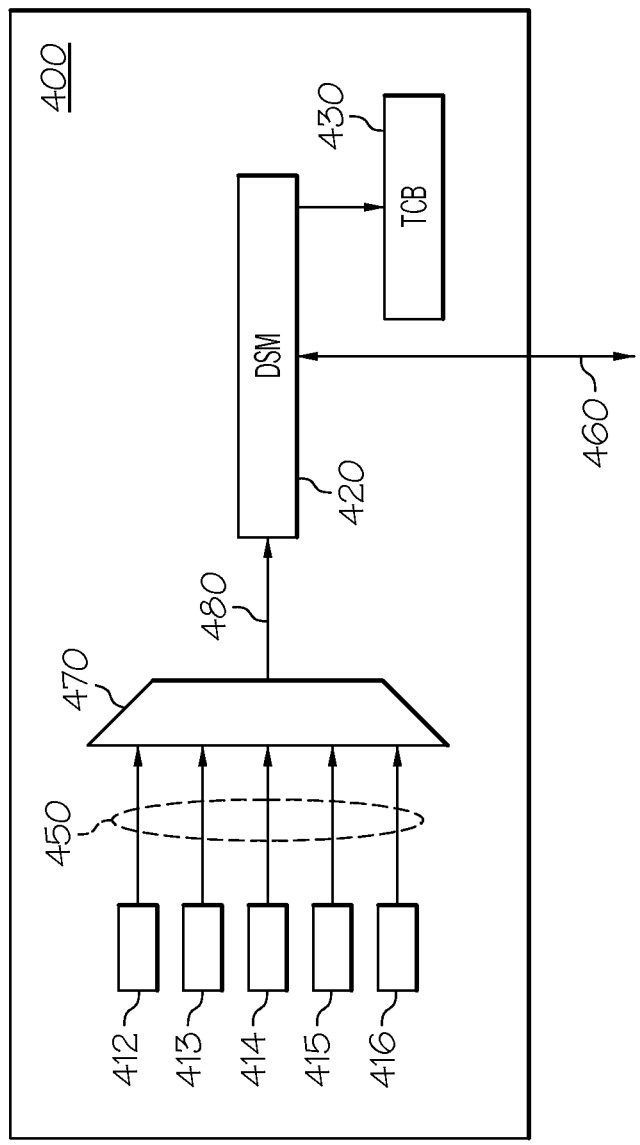
FIG. 4 is a block diagram of an electronic module with an integrated debug state machine, in accordance with another embodiment.

In an embodiment, debug bus 350 is configured as a ring bus, although a debug bus may be differently configured, as well (e.g., a debug bus may have a parallel structure, such as depicted in FIG. 4). In an embodiment, debug bus 350 is 64 bits wide, although debug bus 350 may be wider or narrower, in other embodiments. An advantage to the ring bus structure is that the structure may provide data from numerous observability points 312, 314 without the necessity for extensive parallel routing. However, the ring bus structure may have increased latency when compared with a parallel bus implementation, particularly for observability points (e.g., point 312) that occur earlier in the ring bus.

FIG. 4 is a block diagram of an electronic module 400 with an integrated DSM 420, in accordance with another embodiment. For example, electronic module 400 may be a Northbridge (e.g., Northbridge 254, FIG. 2), a Southbridge (e.g., Southbridge 264, FIG. 2), or a GPU (e.g., GPU 274, FIG. 2), although electronic module 400 may be a different type of electronic module, as well. In an embodiment, as mentioned previously, DSM 420 may be capable of storing trace data in trace data storage (e.g., TCB 430), which includes information collected and/or produced by DSM 420 during execution of various operations performed by the electronic module 400.

Figure 5:
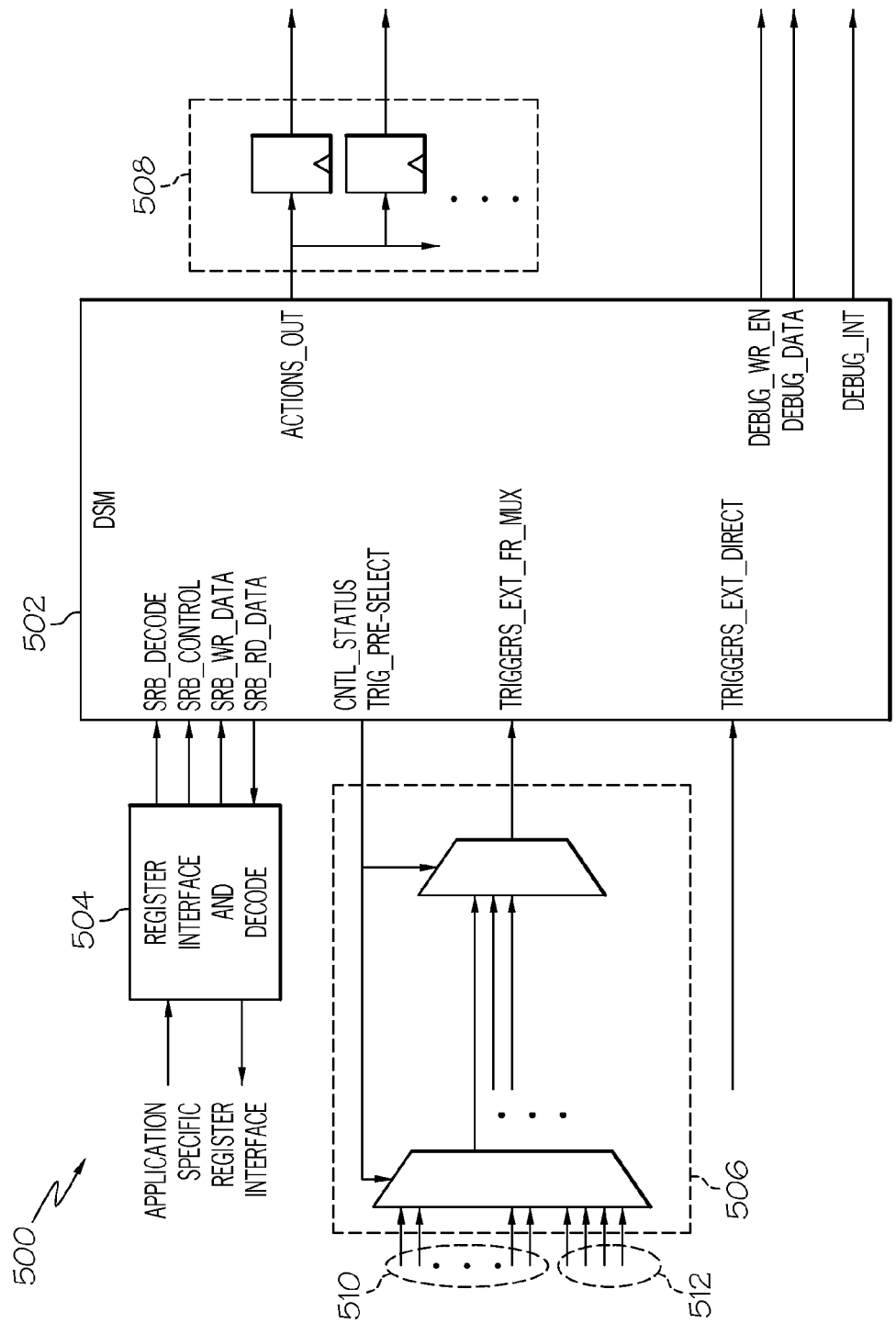
FIG. 5 is a conceptual block diagram of an application-specific wrapper for a debug state machine, which is suitable for use in the system of FIG. 2, in accordance with an embodiment.

DSM 420 is integrated with the various observability points 412, 413, 414, 415, 416 of electronic module 400 by way of debug bus 450 and multiplexer (MUX) 470. Although MUX 470 is shown as a single multiplexer, MUX 470 may be implemented as a hierarchical structure in other embodiments (e.g., as depicted in FIG. 5, described below). Debug bus 450 and MUX 470 function as a conduit through which signals produced at the various observability points 412-416 within electronic module 400 may be conveyed to DSM 420. The output lines 480 from MUX 470 may be fed directly into DSM 420, in an embodiment. Although only five observability points 412-416 are shown in FIG. 4, a multitude of observability points may be established on debug bus 450. At each observability point 412-416, various multiplexing structures may funnel data onto the debug bus 450.

In the embodiment illustrated in FIG. 4, debug bus 450 is configured as a parallel bus. In an embodiment, debug bus 450 may have any number of parallel inputs to MUX 470, although only five are shown in FIG. 4, and the output lines 480 may be 64 bits wide. Alternatively, the output lines 480 may be wider or narrower, in other embodiments. Some or all of the signals received via output lines 480 may be considered as triggering events by DSM 420, which may invoke DSM 420 to produce a cross trigger on a cross trigger bus 460, as described in more detail elsewhere, herein. An advantage to the parallel bus structure is that the structure may provide reduced latency, when compared with the ring bus structure of FIG. 3. However, the parallel bus structure may warrant more extensive parallel routing, particularly when it is desirable to connect the debug bus 450 to numerous observability points.

The actual circuitry of a DSM may have any of a number of configurations that are suitable to facilitate the performance of debug operations within a system. Rather than describing a specific circuitry embodiment, a DSM "wrapper" will be described hereafter, which depicts an embodiment of the interfaces between a DSM and an electronic system. More particularly, FIG. 5 is a conceptual block diagram of an application-specific DSM wrapper 500 for a DSM 502, which is suitable for use in the system of FIG. 2, in accordance with an embodiment. In conjunction with the various inputs and outputs to the DSM 502, the DSM wrapper 500 includes a register interface and decode logic 504, bus multiplexing (MUX) circuitry 506, and action gating circuitry 508.

The register interface and decode logic 504 provides an interface between the DSM 502 and one or more registers of the electronic module with which the DSM 502 is integrated. More particularly, DSM 502 is able to read values from and write values to selected electronic module registers via the register interface and decode logic 504. A decoding input ("SRB_DECODE") to DSM 502 includes a bus (e.g., a 40 bit bus) that facilitates decoding for each DSM register access. According to an embodiment, the decoding is performed within the DSM wrapper 500 such that each application may perform its own debug. A control input ("SRB_CONTROL") to DSM 502 controls reading from and writing to the internal DSM registers. From the SRB bus, a data input ("SRB_WR_DATA") includes a bus (e.g., a 32 bit bus) that facilitates writing of data from the SRB bus of the electronic module into the DSM 502. Conversely, a data output ("SRB_RD_DATA") includes a bus (e.g., a 32 bit bus) that facilitates writing of data from the DSM 502 onto the SRB bus of the electronic module. In this manner, data may be exchanged between the DSM 502 and the electronic module with which the DSM 502 is integrated.

During programming of the DSM 502, values are written into various registers of the DSM 502, which specify to which triggering actions the DSM 502 will respond, and the actions that the DSM 502 will take in response to those triggering actions (e.g., the written values define the trigger-to-action mapping). According to an embodiment, these registers include one or more control status ("CNTL_STATUS") and trigger pre-select ("TRIG_PRE-SELECT") registers. Once programmed, these registers may output control signals to bus MUX circuitry 506, which control which of a plurality of external signals (e.g., signals from debug bus 510 (e.g., debug bus 450, FIG. 4), cross trigger bus 512 (e.g., cross trigger bus 280, FIG. 2), or elsewhere) are permitted to pass through to a first external trigger input ("TRIGGERS_EXT_FR_MUX") to the DSM 502. Accordingly, the receipt and handling of the various triggering inputs is determined, in an embodiment, by the programmed values in the DSM control status and trigger pre-select registers. Although the parallel debug bus 510 and MUX circuitry 506 structure depicted in FIG. 5 is similar to the debug bus 450 and MUX structure 470 depicted and described in conjunction with FIG. 4, it is to be understood that the parallel debug bus 510 and MUX circuitry 506 combination may be replaced with a direct input from a debug bus, such as the ring type debug bus 350 depicted and described in conjunction with FIG. 3, in an alternate embodiment. In addition or alternatively, potentially triggering signals may be provided directly to a second external trigger input ("TRIG- GERS_EXT_DIRECT") to the DSM 502. For example, but not by way of limitation, directly received triggers may include performance monitors, cross triggers, traps, breakpoints, and so on. Since these triggers are directly receivable, the programming of the control status and trigger pre-select registers do not affect their observability, in an embodiment.

As discussed previously, the DSM 502 may take any of a number of actions in response to detecting triggering events based on the various triggering inputs. According to an embodiment, the actions are implemented through one or more outputs ("ACTIONS_OUT") that are gated through action gating circuitry 508. The output signals produced by action gating circuitry 508 may be provided to any of a number of sub-modules of the electronic module with which the DSM 502 is integrated, as well as to other portions of the system outside of the electronic module (e.g., to various clock control circuits, DSM-to-microcode registers, or other electronic modules). In a particular embodiment, one or more outputs of the action gating circuitry 508 are connected to the cross trigger bus (e.g., cross trigger bus 280, FIG. 2), which enables the DSM 502 to generate cross triggers on any one or more conductors of the cross trigger bus. In addition, the DSM 502 may provide die-to-die cross triggers and socket-to-socket cross triggers via the action gating circuitry 508.

In an embodiment, DSM 502 may write debug data out to one or more data storage areas (e.g., to L2 cache 240, 242, 244, 246 and/or to TCB 254, 264, 274, FIG. 2), which are accessible to external test equipment, by asserting a write enable signal (via "DEBUG_WR_EN") and providing the data on data output lines (e.g., "DEBUG_DATA") from the DSM 502. The DSM 502 also may generate interrupts (e.g., microcode interrupts) via an interrupt output ("DEBUG_INT") from the DSM 502 to an interrupt input of another module or sub-module.

FIG. 6 is a flow diagram of a method for setting up and conducting debug operations, in accordance with an embodiment. The method may be performed, for example, in the systems of FIGS. 1 and/or 2, and/or in other suitably configured systems. The method may begin after a device under test (e.g., an integrated circuit, SOC, and/or electronic system) has been connected with appropriate external test equipment that is configured to cause the system to run through one or more test cases. In block 602, the system is booted (e.g., powered up), which includes executing the BIOS (basic input/output system) (e.g., loading the operating system, initializing the system, and so on). During execution of the BIOS, various storage locations for debug data may be configured (e.g., L2 caches 240, 242, 244, 246, FIG. 2).

In block 604, each of the DSMs that will be involved in the debug operation may be programmed. According to an embodiment, each DSM may be programmed to respond to various triggering events by taking particular actions. More particularly, various registers of each DSM may be programmed to determine which external inputs may be multiplexed into the DSM as potentially triggering inputs, and to establish a trigger-to-action mapping within the DSM. As part of this process, each DSM may be programmed to assert various cross trigger signals when particular triggering actions occur, to accept cross trigger signals as triggering inputs, and to perform particular actions when cross trigger signals are received.

According to an embodiment, the DSMs are programmed via the Special Register Bus (SRB). More particularly, while a DSM is in a programmable state, various registers of the DSM are programmed. The values within the programmable registers determine the triggering events to which the DSM will respond. In addition, the values within the programmable registers determine which actions the DSM will take in response to detecting a triggering event (i.e., the registers define a mapping of triggering events to actions). According to a particular embodiment, the registers that determine the triggering events and the responsive actions include the "CNTL_STATUS" and "TRIG_PRE-SELECT" registers previously discussed in conjunction with FIG. 3.

In block 606, the operating system is booted, and the test case may be executed in block 608. During execution of the test case, the DSM may store debug data (e.g., to L2 cache 240, 242, 244, 246 and/or to TCB 254, 264, 274, FIG. 2) that is provided to the DSM and/or generated by the DSM during execution of the test case. Debug data may be stored in any one or more of several modes, in an embodiment. For example, one mode involves storing selected debug data to the state capture buffer (e.g., to L2 cache 240, 242, 244, 246 and/or to TCB 254, 264, 274, FIG. 2). A second mode involves initiating the action of storing all debug data starting at a first time, and continuing until a subsequent action indicates that storing should be discontinued. According to an embodiment, upon any transition from storing to not storing, a timestamp value may be written out, which allows correlation of the data. In another embodiment, timestamp values may be written out at different times, and more or less frequently.

Execution of the test case may continue until it is completed or, in some cases, until it is interrupted (e.g., by the DSM in response to some triggering event). Upon completion or interruption of test case execution, the stored debug data may be accessed by the external test equipment (e.g., from L2 cache 240, 242, 244, 246 and/or from TCB 254, 264, 274, FIG. 2). The method may then end.

FIG. 7 is a flow diagram of a method for operating debug circuitry in the context of a debug operation, in accordance with an embodiment. More particularly, the method of FIG. 7 corresponds to a subset of the operations performed by a DSM in block 608, FIG. 6. The operations, more specifically, correspond to the "pulse mode" of cross triggering, which was referred to above. The method may include at least two parallel actions. One parallel action that may be performed is that of exchanging trace data with the electronic module with which the DSM is integrated (e.g., via the "SRB_WR_DATA" and "SRB_RD_DATA" input/output discussed in conjunction with FIG. 5), and storing the trace data and/or other data generated by the DSM as debug data (e.g., to cache 240, 242, 244, 246 and/or from TCB 254, 264, 274, FIG. 2), in block 702. These processes may continue throughout execution of the test case.

In addition, another parallel action that may be performed includes detecting externally-originated triggering events (e.g., triggering actions based on external signals) and/or generating internal triggering events, in block 704. According to an embodiment, one type of externally-originated triggering event is the assertion of a cross trigger by another DSM of the system, as discussed previously. When an external or internal triggering event has occurred and has been detected by the DSM, the DSM may determine a responsive action to perform (e.g., the DSM may map the trigger to an action), in block 706. The DSM may then perform the action, in block 708. As discussed previously, one type of action that the DSM may perform includes the DSM asserting a cross trigger. The method may then iterate as shown, until execution of the test case is either completed or interrupted. It is to be understood that the DSM may perform a variety of additional computational and evaluative processes in conjunction with the execution of a particular test case, and that FIG. 7 is a simplified flow chart intended to highlight embodiments relating to pulse mode cross triggering between DSMs.

FIG. 8 is a flow diagram of a method for operating debug circuitry in the context of a debug operation, in accordance with another embodiment. More particularly, the method of FIG. 8 corresponds to a subset of the operations performed by a plurality of DSMs in block 608, FIG. 6. The operations, more specifically, correspond to the "level mode" of cross triggering, which was referred to above. In an embodiment, level mode cross triggering is performed by DSMs that are integrated with processing cores (e.g., by DSMs 230-1, 230-2, 230-3, 230-4 that are integrated with processing cores 220, 222, 224, 226, FIG. 2). However, level mode cross triggering may be performed by DSMs that are integrated with electronic modules other than processing cores, as well.

Each DSM involved in the level mode cross triggering performs a sequence of events. Because the electronic modules with which each DSM is integrated may operate independently from the other electronic modules, the sequence of events performed by one DSM may be performed in parallel with the sequence of events performed by another DSM that is involved in the level mode cross triggering. Accordingly, in FIG. 8, a sequence of events 810 performed by "DSM 1" is shown to be performed in parallel with a sequence of events 820 performed by "DSM N". Although parallel event sequences 810, 820 are shown for only two DSMs (i.e., DSM 1 and DSM N), it is to be understood that more than two DSMs may participate in level mode cross triggering (e.g., N may be any integer greater than 1).

In block 802-1, 802-N (collectively 802), each DSM involved in a level mode cross triggering process produces a first cross trigger signal on the cross trigger bus. The first cross trigger signal indicates that the triggering event that the DSM is waiting to detect has not yet occurred. In an embodiment, each DSM involved in the process is assigned to a different conductor of the cross trigger bus, and each DSM produces the first cross trigger signal on the conductor to which it is assigned. Producing the first cross trigger signal may include, for example, asserting a signal on the cross trigger bus (e.g., establishing a relatively high voltage signal on a conductor of the cross trigger bus to which the DSM is assigned). In another embodiment, producing the first cross trigger signal may include de-asserting a signal on the cross trigger bus (e.g., establishing a relatively low voltage signal on a conductor of the cross trigger bus to which the DSM is assigned).

In block 804-1, 804-N (collectively 804), each DSM then determines whether a triggering event has occurred and/or been detected by the DSM (e.g., externally-originated triggering events or internal triggering events). In an embodiment, each DSM may determine whether the same type of triggering event has occurred. For example, the triggering event may be a particular configuration space access made by a driver with which a DSM is integrated, and each DSM may determine whether its corresponding driver has made the particular configuration space access. When it has, the DSM may determine that the triggering event has occurred. Alternatively, each DSM may await the occurrence of a different type of triggering event from the other DSMs. Either way, when the triggering event for which the DSM is awaiting has not occurred, the method iterates as shown. Because the electronics modules with which the DSMs are integrated may operate independently from each other, each DSM may detect the occurrence of a triggering event at a different time from the other DSMs. In addition, some DSMs may never detect the triggering event, which may indicate an error condition. Accordingly, although blocks 804 through 810 are indicated to occur in parallel, that is not to imply that corresponding blocks occur simultaneously (e.g., DSM 1 may detect a triggering event at a different time from DSM N, and accordingly, DSM 1 may perform subsequent blocks 806, 808, 810 at different times from DSM N).

Upon detecting that the triggering event for which a DSM was waiting has occurred, the DSM may produce a second cross trigger signal on the cross trigger bus, in block 806-1, 806-N (collectively 806). The second cross trigger signal indicates that the triggering event that the DSM has been waiting to detect has occurred. Producing the second cross trigger signal may include, for example, de-asserting the previously asserted signal on the cross trigger bus (e.g., establishing a relatively low voltage signal on a conductor of the cross trigger bus to which the DSM is assigned). In another embodiment, producing the first cross trigger signal may include asserting a signal on the cross trigger bus (e.g., establishing a relatively high voltage signal on a conductor of the cross trigger bus to which the DSM is assigned).

The DSM may then determine, in block 808-1, 808-N (collectively 808) whether all other DSMs involved in the level mode cross trigger operation have produced the second cross trigger signal on the cross trigger bus (e.g., whether all N DSMs have indicated that they have detected their respective triggering event). When the DSM determines that fewer than all other DSMs have produced the second cross trigger signal, the method may iterate as shown. When the DSM determines that all of the other DSMs have produced the second cross trigger signal, the DSM may determine and take an appropriate responsive action, in block 810-1, 810-N (collectively 810). For example, the DSM may map the trigger to an action, and then may then perform the action. The method may then end. It is to be understood that the DSM may perform a variety of additional computational and evaluative processes in conjunction with the execution of a particular test case, and that FIG. 8 is a simplified flow chart intended to highlight embodiments relating to level mode cross triggering between DSMs.

Although not shown in FIG. 8, each DSM also may perform a parallel action of exchanging trace data with the electronic module with which the DSM is integrated (e.g., via the "SRB_WR_DATA" and "SRB_RD_DATA" input/output discussed in conjunction with FIG. 5), and storing the trace data and/or other data generated by the DSM as debug data (e.g., to cache 240, 242, 244, 246 and/or from TCB 254, 264, 274, FIG. 2). These processes may continue throughout execution of the test case.

For the sake of brevity, conventional techniques related to integrated circuit design, caching, memory operations, memory controllers, and other functional aspects of the systems (and the individual operating components of the systems) have not been described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for performing debug operations in an electronic system that includes a first electronic module and a second electronic module, the method comprising:
    a first debug circuit, which is integrated with the first electronic module, determining that a triggering event has occurred;
    the first debug circuit producing a first cross trigger signal on a communications interface between the first debug circuit and a second debug circuit integrated with the second electronic module in response to determining that the triggering event has occurred; and
    in response to detecting the first cross trigger signal, the second debug circuit identifying a debug action corresponding to the first cross trigger signal based on a trigger-to-action map and performing the debug action in the second electronic module.

2. The method of claim 1, wherein determining that the triggering event has occurred comprises:
    receiving one or more signals from one or more sources external to the first debug circuit, wherein the one or more signals are selected from a group consisting of a second cross trigger signal on the communications interface; a debug bus bit having a pre-defined state; a debug bus bit transition occurring; a trap signal; a clock stop signal; an error signal; a performance monitor signal; an interrupt; a microcode-based trigger; a breakpoint; and a timer overflow;
    determining whether the one or more signals have one or more pre-defined values or states; and
    when the one or more signals have the one or more pre-defined values or states,
    determining that the triggering event has occurred.

3. The method of claim 1, wherein determining that the triggering event has occurred comprises:
    determining whether an internal triggering event has occurred, wherein the internal triggering event is selected from a group consisting of a counter matching a first value; a clock count matching a second value; trace data matching a third value; trace data exceeding a fourth value; debug data matching a fifth value; a random event occurring; and
    a flag being asserted.

4. The method of claim 1, further comprising: the second debug circuit performing a mapping operation to determine the action.

5. The method of claim 1, wherein the action is selected from a group consisting of generating a second cross trigger signal on the communications interface; generating a core stop clock signal; generating a die-wide stop clock signal; generating a self refresh signal for a memory; generating a communication interface receive disable signal; generating a trace store signal; generating a machine check exception (MCE) signal; generating a debug event signal; triggering a debug microcode interrupt; and setting and clearing various bits in a register to be read by microcode upon the debug microcode interrupt.

6. The method of claim 1, further comprising: programming the first debug circuit to produce the first cross trigger signal in response to the triggering event; and programming the second debug circuit to perform the action in response to detecting the first cross trigger signal.

7. The method of claim 1, wherein the first electronic module and the second electronic module are included within an integrated circuit, the communications interface includes a cross trigger bus within the integrated circuit, and wherein producing the first cross trigger signal comprises asserting a signal on a conductor of the cross trigger bus.

8. The method of claim 1, wherein the first electronic module is included within a first integrated circuit of a multiple-chip module (MCM), the second electronic module is included within a second integrated circuit of the MCM, the communications interface includes one or more pins of each of the integrated circuits and conductors between the one or more pins of the integrated circuits, and wherein the first cross trigger signal is produced on a pin of the first integrated circuit.

9. The method of claim 1, wherein the first electronic module is included within a first device package installed in a first socket of the electronic system, and the second electronic module is included within a second device package installed in a second socket of the electronic system, the communications interface includes one or more pins of each of the device packages and conductors on the printed circuit board between the plurality of sockets, and wherein producing the first cross trigger signal on the communications interface comprises driving a signal on a pin of the first device package.

10. A method for performing debug operations in an electronic system that includes a first electronic module and a second electronic module, the method comprising:
    a first debug circuit, which is integrated with the first electronic module, detecting that a first cross trigger signal has been produced on a communications interface between the first debug circuit and a second debug circuit integrated with the second electronic module; and
    in response to detecting the first cross trigger signal, the first debug circuit identifying a debug action corresponding to the first cross trigger signal based on a trigger-to-action map and performing the debug action in the first electronic module.

11. The method of claim 10, wherein the action is selected from a group consisting of generating a second cross trigger signal on the communications interface; generating a core stop clock signal; generating a die-wide stop clock signal; generating a self refresh signal for a memory; generating a communication interface receive disable signal; generating a trace store signal; generating a machine check exception (MCE) signal; generating a debug event signal; triggering a debug microcode interrupt; and setting and clearing various bits in a register to be read by microcode upon the debug microcode interrupt.

12. The method of claim 10, further comprising, prior to the detecting step, of:
the second debug circuit, which is integrated with the second electronic module,
determining that a triggering event has occurred; and
the second debug circuit producing the first cross trigger signal on the communications interface in response to determining that the triggering event has occurred.

13. The method of claim 12, wherein the triggering event comprises one or more events selected from a group consisting of a counter matching a first value; a clock count matching a second value; trace data matching a third value; trace data exceeding a fourth value; debug data matching a fifth value; a debug bus bit having a pre-defined state; a debug bus bit transition occurring; a random event occurring; a flag being asserted; and receiving one or more signals from one or more sources external to the second electronic module, wherein the one or more signals are selected from a group consisting of a second cross trigger signal on the communications interface; a trap signal; a clock stop signal; an error signal; a performance monitor signal; an interrupt; a microcode-based trigger; a breakpoint; and a timer overflow.

14. An electronic system comprising:
a first electronic module;
a second electronic module;
a first debug circuit integrated with the first electronic module, wherein the first debug circuit is configured to determine that a triggering event has occurred, and to produce a first cross trigger signal on a communications interface between the first debug circuit and a second debug circuit in response to determining that the triggering event has occurred;
the second debug circuit integrated with the second electronic module, wherein the second debug circuit is configured to detect the first cross trigger signal on the communications interface, and in response to detecting the first cross trigger signal, to identify a debug action corresponding to the first cross trigger signal based on a trigger-to-action map and to perform the debug action in the second electronic module.

15. The electronic system of claim 14, wherein the first electronic module and the second electronic module include one or more types of electronic modules selected from a group consisting of a processor core, a Northbridge, a Southbridge, a graphics processing unit, and a special purpose processor.

16. The electronic system of claim 14, wherein the first electronic module is included within a first integrated circuit of a multiple-chip module (MCM), the second electronic module is included within a second integrated circuit of the MCM, and the communications interface includes a die-to-die interface within the MCM.

17. The electronic system of claim 14, wherein the first electronic module is included within a first device package installable in a first socket of the electronic system, and the second electronic module is included within a second device package installable in a second socket of the electronic system that is communicatively coupled with the first socket, and the communications interface comprises at least a first pin of the first device package, a conductive path on a printed circuit board between the first socket and the second socket, and a second pin of the second device package.

18. The electronic system of claim 14, wherein the first electronic module and the second electronic module are included within an integrated circuit, and the communications interface includes a cross trigger bus within the integrated circuit.

19. The electronic system of claim 18, wherein the cross trigger bus comprises a plurality of conductors arranged in a parallel configuration.

\* \* \* \* \*